(12) United States Patent
Fukuhara et al.

(10) Patent No.: US 7,940,114 B2
(45) Date of Patent: May 10, 2011

(54) SEMICONDUCTOR DEVICE AND OFFSET VOLTAGE ADJUSTING METHOD

(75) Inventors: Jun Fukuhara, Kawasaki (JP); Tsuyoshi Mitsuda, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 11 days.

(21) Appl. No.: 12/179,666

(22) Filed: Jul. 25, 2008

(65) Prior Publication Data

US 2009/0027107 A1 Jan. 29, 2009

(30) Foreign Application Priority Data

Jul. 25, 2007 (JP) .................. 2007-193086

(51) Int. Cl.
*H01H 37/76* (2006.01)
*H01H 85/00* (2006.01)
(52) U.S. Cl. ...................................... 327/525
(58) Field of Classification Search .......... 327/525–526; 365/225.7
See application file for complete search history.

(56) References Cited

U.S. PATENT DOCUMENTS

| 5,418,487 | A | 5/1995 | Armstrong, II | |
|---|---|---|---|---|
| 5,929,691 | A * | 7/1999 | Kim et al. | 327/525 |
| 6,194,962 | B1 | 2/2001 | Chen | |
| 6,396,339 | B1 | 5/2002 | Jacobs | |
| 6,424,211 | B1 | 7/2002 | Nolan et al. | |
| 6,628,160 | B2 * | 9/2003 | Lin et al. | 327/534 |
| 6,781,900 | B2 * | 8/2004 | Furutani et al. | 365/201 |
| 6,967,526 | B1 | 11/2005 | Churchill | |
| 2003/0184459 | A1 | 10/2003 | Engl | |

FOREIGN PATENT DOCUMENTS

| EP | 0 644 554 | 3/1995 |
|---|---|---|
| EP | 0644554 | 3/1995 |
| JP | 2004-253676 | 9/2004 |
| JP | 2006-344793 | 12/2006 |
| JP | 2004-253676 | 9/2007 |

OTHER PUBLICATIONS

European Search Report was issued on Nov. 13, 2008 in the corresponding European patent application No. 08013380.4.
European Search Report—EP 08 01 3380—Mar. 3, 2009.

* cited by examiner

*Primary Examiner* — Quan Tra
(74) *Attorney, Agent, or Firm* — Young & Thompson

(57) ABSTRACT

A semiconductor device includes a fuse section having a plurality of fuse circuits configured to generate switch control signals; and an offset adjusting section configured to adjust an offset voltage of a differential amplifier based on the switch control signals supplied from output nodes of the plurality of fuse circuits. Each of the plurality of fuse circuits includes a fuse connected between a first power supply voltage and a cut node; a current source connected between a second power supply voltage and the output node; and a first transistor connected between the output node and the cut node and having a gate connected to the second power supply voltage.

19 Claims, 7 Drawing Sheets

FIG. 4

| PATTERN | FUSE F11 | FUSE F12 | FUSE F13 | FUSE F14 | ADJUSTMENT VOLTAGE [mV] |
|---|---|---|---|---|---|
| 16 | CONNECT | CONNECT | CONNECT | CONNECT | 7 |
| 15 | CUT | CONNECT | CONNECT | CONNECT | 6 |
| 14 | CONNECT | CUT | CONNECT | CONNECT | 5 |
| 13 | CUT | CUT | CONNECT | CONNECT | 4 |
| 12 | CONNECT | CONNECT | CUT | CONNECT | 3 |
| 11 | CUT | CONNECT | CUT | CONNECT | 2 |
| 10 | CONNECT | CUT | CUT | CONNECT | 1 |
| 9 | CUT | CUT | CUT | CONNECT | 0 |
| 8 | CONNECT | CONNECT | CONNECT | CUT | −7 |
| 7 | CUT | CONNECT | CONNECT | CUT | −6 |
| 6 | CONNECT | CUT | CONNECT | CUT | −5 |
| 5 | CUT | CUT | CONNECT | CUT | −4 |
| 4 | CONNECT | CONNECT | CUT | CUT | −3 |
| 3 | CUT | CONNECT | CUT | CUT | −2 |
| 2 | CONNECT | CUT | CUT | CUT | −1 |
| 1 | CUT | CUT | CUT | CUT | 0 |

SEMICONDUCTOR DEVICE AND OFFSET VOLTAGE ADJUSTING METHOD

INCORPORATION BY REFERENCE

This application claims a priority on convention based on Japanese Patent Application No. 2007-193086. The disclosure thereof is incorporated herein by reference.

BACKGROUND OF THE INVENTION

1. Field of the Invention

The present invention relates to a semiconductor device and an offset voltage adjusting method, and more particularly relates to a semiconductor device able to confirm adjustment values of voltage and current depending on a fuse connected/cut state before the fuse cutting and to an offset voltage adjusting method capable of confirming an adjustment value of an offset voltage of a differential amplifier before the fuse cutting.

2. Description of Related Art

In recent years, the number of electronic parts has increased in an automobile and a development of not only an ECU (Electric Control Unit) but also a PCU (Power Control Unit) has progressed. A role of an IC mounted on the PCU is a control of a load part driven with a large current (for example, a lamp of a headlight and motors used for sliding operations of doors and side mirrors). The large current must be accurately controlled.

It is important to reduce the offset voltage of an operational amplifier used in a system for controlling this large current with a high degree of accuracy. The offset voltage of the operational amplifier is generally generated because of a variation of elements on the manufacture, and can be reduced when a layout of the element is carried out by using a large area. However, in an IC which is requited to be miniaturized and to mount various circuits including the operational amplifier on one chip, an area for the operational amplifier is limited, so that the offset voltage sometimes cannot be sufficiently reduced. Consequently, an adjustment element is preliminarily mounted in order to adjust the generated offset voltage, and the fuse connected/cut states of the adjustment element are changed through the cutting of the fuse depending on the generated offset voltage to adjust the offset voltage.

In addition, in case of adjusting the offset voltage in a high accuracy, a desired adjustment value sometimes cannot be obtained because of the variation of elements on the manufacture even when the fuse is cut correctly in accordance with a design. For this reason, it is useful to realize an internal state equivalent to a circuit in which the fuse has been cut before the fuse cutting and to be able to know the adjustment value.

In conjunction with the above description, a related art allowing a confirmation of an output value after the fuse cutting prior to the fuse cuttings will be described below. In a semiconductor device in Japanese Patent Application Publication (JP-P2006-344793A), an internal circuit equivalent to a circuit in which the fuse has been cut, is realized by applying a voltage on a test node other than a node for the fuse cutting (hereinafter, to be referred to as a fuse cutting node). In a system requiring a high accuracy of the adjustment value, a fuse sometimes has a value different from a design value because of the variation of element on the manufacture. Accordingly, it is important to be able to know an internal circuit as an arbitrary combination of connected and cut fuses in a system requiring a high accuracy of the adjustment value.

A method for realizing a state of an internal circuit equivalent to a circuit in which the fuse has been cut without adding a test node is described in Japanese Patent Application Publication (JP-P2004-253676A). Referring to FIG. 1, a semiconductor device described in Japanese Patent Application Publication (JP-P2004-253676A) includes a fuse 102 connected between a node 101 to which a voltage V1 is externally applied and an N-channel MOS transistor MN100 whose gate and source are grounded via an output node 104 and a LED (Light Emitting Diode) 105. The fuse 102 and a drain of the N-channel MOS transistor MN100 are connected to a fuse cutting node 103. When the fuse 102 is cut, a current $I_0$ flown from a source of the N-channel MOS transistor MN100 is 0 A. In order to establish a circuit state equivalent to a circuit in case of the fuse cutting without cutting the fuse, a predetermined voltage $V_2$ is applied to the fuse cutting node 103 to withdraw the current to the fuse cutting node 103. Accordingly, the current $I_0$ becomes 0 A to realize the internal state equivalent to the fuse cutting state. In addition, since the fuse cutting node 103 is a node used in the fuse cutting, there is no need to add the test node as described in Japanese Patent Application Publication (JP-P2006-344793A). In this method, an adjustment value of trimming (a current flowing through the LED 105) can be known before the adjustment and there is no need to add a node.

A semiconductor device described in Japanese Patent Application Publication (JP-P2006-344793A) requires adding a test node in order to realize the internal circuit state after the fuse has been cut to increase a circuit area. Meanwhile, without adding the test node, the semiconductor device described in Patent document 2 can realize the internal state after the fuse has been cut with using a cutting node.

However, in a case of realizing an internal state after a fuse has been cut, it is simultaneously required for a semiconductor device described in Patent document 2 to apply a voltage to the cutting node and to withdraw a current from the node. Since being set by a tester, a current value withdrawn from the fuse cutting node 103 can be a constant value. On the contrary, a current drive force (a current amount that a transistor can flow) of an element (the N-channel MOS transistor N-channel MOS transistor MN100) cannot be a constant value because of the quality variation, and there is a possibility that a desired configuration described above, the current value I0 is 0 A, cannot be realized. It is required to preliminarily measure the current drive force of the element and to change the current value I0 for each of circuits to be tested in order to change the current value I0 from the node depending on the quality variation of the elements. This leads to an increase of a test time. In addition, in a case where a current value of the LED 105 to be adjusted is small, an extremely high accuracy is required with respect to a current value withdrawn by the tester.

SUMMARY

In an aspect of the present invention, a semiconductor device includes a fuse section having a plurality of fuse circuits configured to generate switch control signals. Each of the plurality of fuse circuits includes a fuse connected between a first power supply voltage and a cut node; a current source connected between a second power supply voltage and the output node; and a first transistor connected between the output node and the cut node and having a gate connected to the second power supply voltage.

In another aspect of the present invention, a method of adjusting an offset voltage is achieved by supplying an adjustment data to a fuse section; by confirming that an offset voltage of a differential amplifier is adjusted based on the adjustment data, without cutting any fuse of the fuse section;

and by cutting the fuses of the fuse section based on the adjusted data when it is confirmed that the offset voltage is adjusted.

According to the present invention, in a semiconductor device in which an output is changed depending on cut states of fuses, an output after the fuse cutting can be realized in a high accuracy prior to the fuse cutting.

In addition, an adjustment of an offset voltage in a differential amplifier can be performed with high accuracy.

BRIEF DESCRIPTION OF THE DRAWINGS

The above and other objects, advantages and features of the present invention will be more apparent from the following description of certain embodiments taken in conjunction with the accompanying drawings, in which;

FIG. 4 is a table showing a relation between connection/disconnection patterns and offset adjustment voltages of fuses according to the present invention;

DESCRIPTION OF THE PREFERRED EMBODIMENTS

Figure 1:
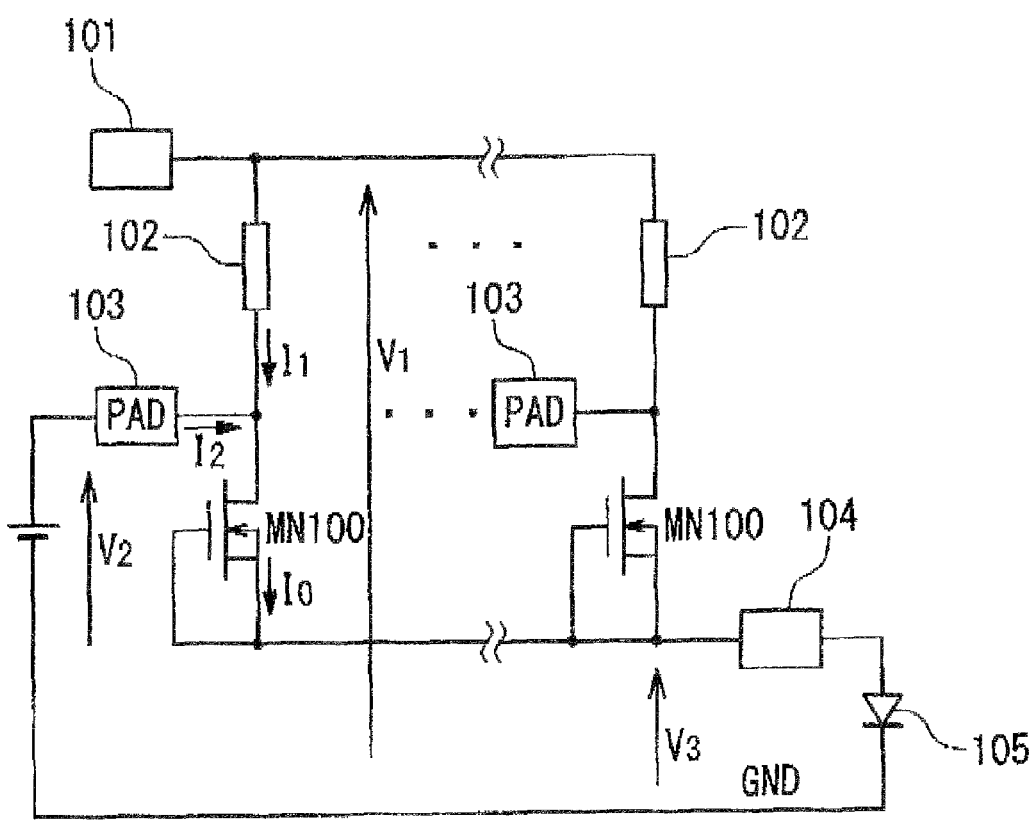
FIG. 1 is a circuit diagram showing a configuration of a fuse circuit according to a conventional technique.

Hereinafter, a semiconductor device according to the present invention will be described in detail with reference to the attached drawings. Same or similar reference numerals assigned to same or similar components in the drawings. The semiconductor device according to the present invention will be described.

First Embodiment

Figure 2:
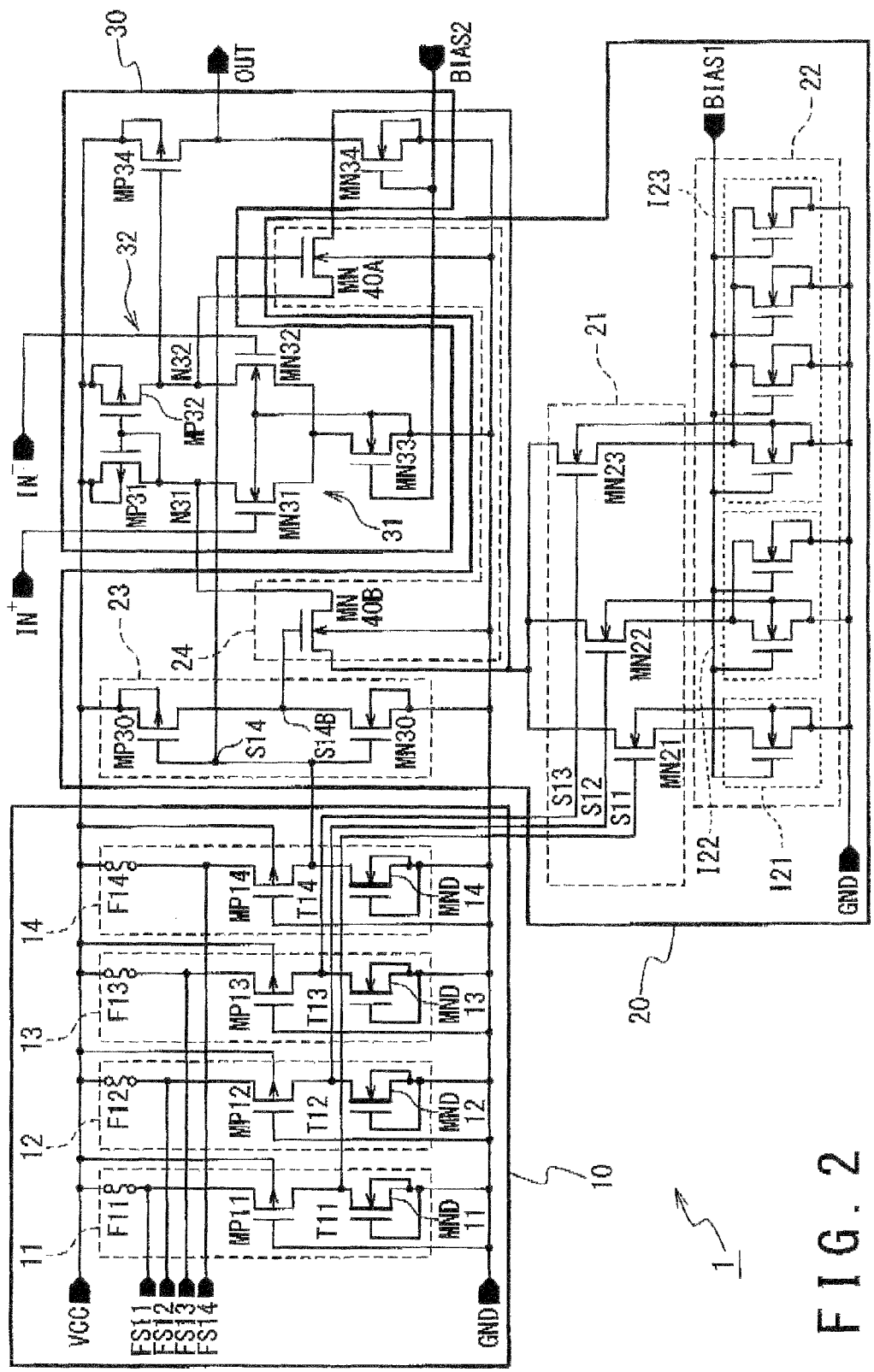
FIG. 2 is a circuit diagram showing a configuration in a first embodiment of a semiconductor device according to the present invention.

FIG. 2 is a circuit diagram showing a configuration of the semiconductor device 1 according to a first embodiment of the present invention. Referring to FIG. 2, the semiconductor device 1 in the first embodiment includes a fuse section 10, an offset adjusting section 20, and a differential amplifier 30.

The fuse section 10 includes a plurality of fuse circuits 11 to 14 to which a plurality of fuse circuit signals FS11 to FS14 of an adjustment signal are respectively supplied. The fuse circuits 11 to 14 simulate cut states of the fuses F11 to F14 in accordance with the fuse circuit signals FS11 to FS14 and outputs switch control signals S11 to S14 for adjusting an offset voltage. The switch control signals S11 to S13 are used for determining an offset adjustment voltage value (an absolute value of the offset adjustment voltage). The switch control signal S14 is used for determining a sign of the offset adjustment voltage. Details of configurations of the fuse circuits 11 to 14 will be described below.

The offset adjusting section 20 adjusts an offset voltage of the differential amplifier 30 through trimming by using a 4-bit adjustment signal (FS11 to FS14). The offset adjusting section 20 determines a current supplied from the constant current source section 22 to the differential amplifier 30 through switching operations controlled in response to the switch control signals S11 to S14. The offset adjusting section 20 includes a switch section 21, a constant current source section 22 having a plurality of constant current sources I21 to I23, and a switch section 24. The switch section 21 includes N-channel MOS transistors MN21 to MN23 as a plurality of first switches. The switch section 24 includes two switches (N-channel MOS transistors MN40A and MN40B).

Gates of N-channel MOS transistors MN21 to MN23 are connected to the output nodes T11 to T13 of the fuse circuits 11 to 13, sources thereof are connected to the constant current sources I21 to I23, and drains thereof are commonly connected to sources of N-channel MOS transistors MN40A and MN40B. The constant current sources I21 to I23 include N-channel MOS transistors in which a bias voltage BIAS1 is supplied to the gates, and the sources are commonly connected to a ground voltage GND which is one power supply voltage. It is preferable that each of the constant current sources I21 to I23 has transistors of a number proportional to a power of 2. In the present embodiment, the constant current source I21 includes one transistor, the constant current source I2 includes two transistors, and a constant current source I3 includes four transistors. Accordingly, the offset voltage can be adjusted based on a binary number and easily controlled. Drains of transistors provided for each of the constant current sources I21 to I23 are connected to sources of the corresponding N-channel MOS transistors MN21 to MN23. The drain of transistor in the constant current source I21 connects to the source of the N-channel MOS transistor MN21, and the drains of two transistors in the constant current source I22 are connected to the source of the N-channel MOS transistor MN22 for example. The N-channel MOS transistors MN21 to MN23 selectively output currents outputted from the constant current sources I21 to I23 to the N-channel MOS transistors MN40A and MN40B.

A complementary signal generating circuit 23 includes P-channel MOS transistors MP30 and MN30 of a complementary type inverter. The complementary signal generating circuit 23 sets the switch control signal S14 outputted from the fuse circuit 14, and outputs the switch control signal S14 to the gate of the N-channel MOS transistor MN40A, and outputs the switch control signal S14B that is an inverted signal of the switch control signal to a gate of the N-channel MOS transistor MN40B. The N-channel MOS transistors MN40A and MN40B control currents outputted from the plurality of N-channel MOS transistors MN21 to MN23 to the differential amplifier 30 based on switching operations according to the switch control signals S14 and S14B.

Meanwhile, the differential amplifier 30 includes a differential pair 31 of an N-channel MOS transistor MN31 and an N-channel MOS transistor MN32 and a current mirror circuit 32 connected via the differential pair 31 and nodes N31 and N32. The current mirror circuit includes P-channel MOS transistors MP31 and MP32. The P-channel MOS transistor MP31 is connected to the N-channel MOS transistor MN31 via the node N31 and the P-channel MOS transistor MP32 is connected to the N-channel MOS transistor MN32 via the node N32. In addition, the differential amplifier 30 includes an N-channel transistor MN33 grounded at a source and connected to the differential pair 31 at a drain. A substrate or well on which the transistors are formed is grounded. The voltage of the substrate or well is referred to as a well voltage hereinafter. In the N-channel transistor MN33 in which a bias voltage BIAS2 is supplied to a gate operates as a constant current source.

The N-channel MOS transistor MN40A controls a connection between the constant current source circuit 22 and the node N32 in accordance with the switch control signal S14. In addition, an N-channel MOS transistor MN40B controls a connection between the constant current source circuit 22 and the node N31 in accordance with the switch control signal S14B. For this reason, the N-channel MOS transistor MN40A is in an ON state and the N-channel MOS transistor MN40B is in an OFF state when the switch control signal S14 is in a high level (a power source voltage VCC) and an output current from the constant current source circuit 22 is supplied to the node N32. In addition, the N-channel MOS transistor MN40A is in an OFF state and the N-channel MOS transistor MN40B is in an ON state when the switch control signal S14 is in a low level (a GND voltage) and the output current from the constant current source circuit 22 is supplied to the node N31. As describe above, a current for adjusting the offset voltage is branched to either the node N31 or the node N32 functioning as a current path of the differential amplifier 30 and an imbalance of current sources (the differential pair) of the differential amplifier 30 on left and right sides is reduced.

The offset voltage of the differential amplifier 30 is generated due to a difference between the currents flowing through the N-channel MOS transistors MN31 and MN32 of the current source (the differential pair) of the differential amplifier 30, that is, the currents in the nodes N31 and N32. In the present invention, the difference in the current causing this offset voltage is adjusted by the output current from the constant current source circuit 22 in the offset adjusting section 20. A magnitude of the output current outputted from the offset adjusting section 20 to the differential amplifier 30 is set based on the signal levels of the switch control signals S11 to S13 from the fuse section 10. In addition, a polarity of the offset adjustment voltage is set based on a signal level of the switch control signal S14. For this reason, the offset voltage can be reduced to a desired value by adequately selecting and adjusting the connection/cut state of the fuses F11 to F14.

Next, referring to FIG. 3, a configuration of the fuse circuits 11 to 14 in the first embodiment will be described. Since the fuse circuits 11 to 14 have the same configuration, only the configuration of the fuse circuit 11 will be described in detail and others are omitted.

Figure 3:
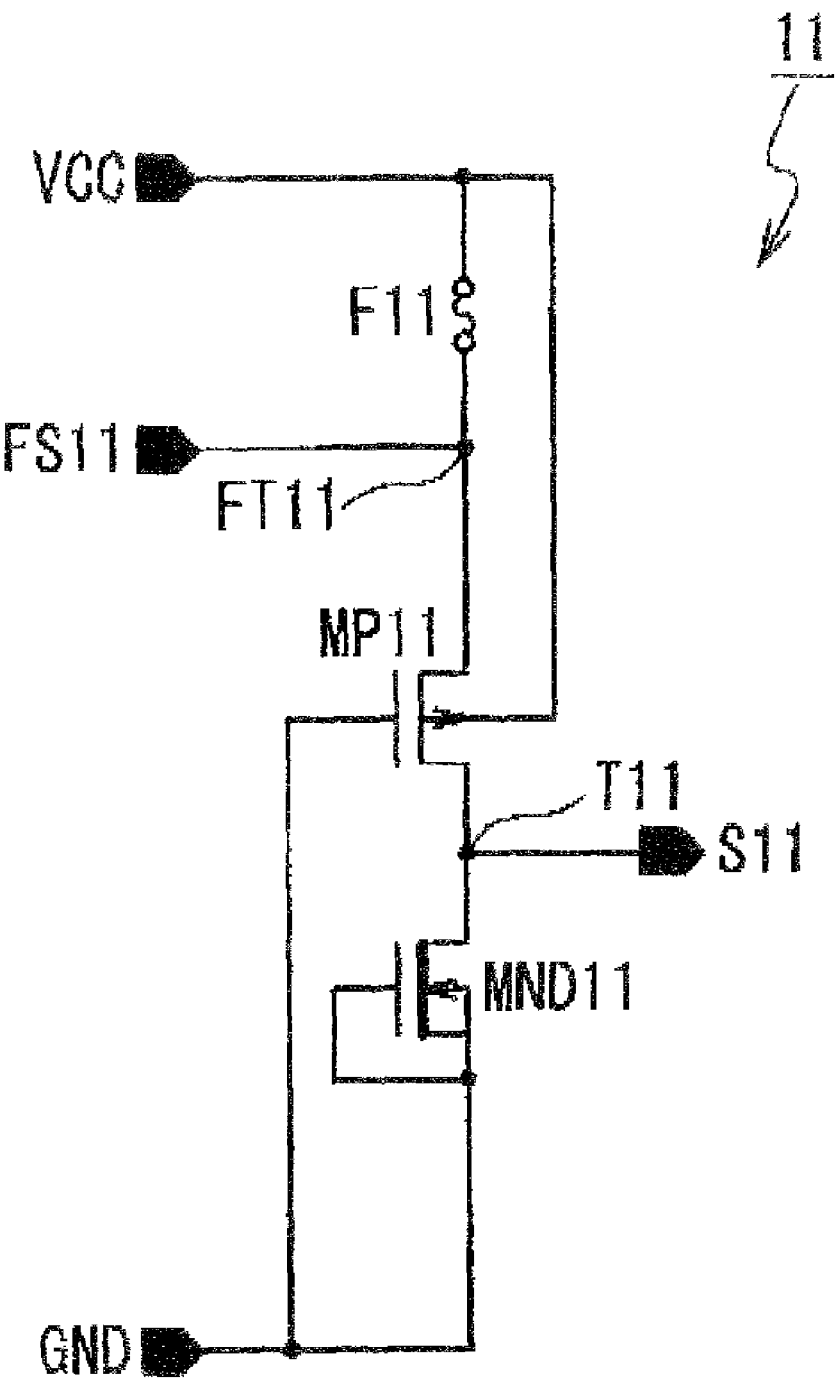
FIG. 3 is a circuit diagram showing a configuration in the first embodiment of the fuse circuit according to the present invention.

Referring to FIG. 3, the fuse circuit 11 in the first embodiment includes a fuse F11 connected between a first power supply (a power supply voltage VCC) and a node FT11, a P-channel MOS transistor MP11 of an enhancement type, and an N-channel MOS transistor MND11 of a depletion type. A source, a gate, and the well voltage for the N-channel MOS transistor MND11 are connected to a second power supply (a ground voltage GND) and a drain of the N-channel MOS transistor MND11 is connected to the output node T11. The P-channel MOS transistor MP11 is connected between the drain of the N-channel MOS transistor MND11 and to the node FT11. To be more detailed, the source of the P-channel MOS transistor MP11 is connected to the node FT11 and the fuse F11 and the drain of the P-channel MOS transistor MP11 is connected to the output node T11 and the drain of the MND11. In addition, a gate of the P-channel MOS transistor MP11 is grounded to the ground voltage GND and the well voltage of the P-channel MOS transistor MP11 is connected to the power supply voltage VCC.

For example, when the fuse F11 which is cut in a voltage of about 20V is used, the fuse F11 is cut when a voltage of about (VCC−20)V is applied to the cutting node FS11. Since a current path is broken when the fuse F11 is cut, the P-channel MOS transistor MP11 of an enhancement type is in an OFF state. The drain of the N-channel MOS transistor MND11 of a depletion type, that is, the output node T11 is in the GND voltage. On the contrary, when the fuse F11 is in the connection state, the P-channel MOS transistor MP11 is in the ON state. When a current drive ability of the P-channel MOS transistor MP11 is larger than the current drive ability of the N-channel MOS transistor MND11, the voltage of the output node T11 becomes a same level as the power supply voltage VCC in the connection state of the fuse F11.

In addition, in order to realize the cut state of the fuse F11 without cutting the fuse F11, the current path to the N-channel MOS transistor MND11 is simply blocked by setting the P-channel MOS transistor MP11 to be the OFF state. For example, when a threshold voltage of the P-channel MOS transistor MP11 in which a back gate effect acts is about 3V, the P-channel MOS transistor MP11 is in the OFF state when a voltage of about (VCC−3)V is applied to the node FT11. At that time, an internal state equivalent to the cut state of the fuse F11 is realized and the output node T11 is in the GND voltage. That is to say, the internal state equivalent to the cut state of the fuse can be realized by applying a voltage setting the P-channel MOS transistor MP11 to the OFF state to the node FT11. It should be noted that a depletion type transistor is used for the N-channel MOS transistor MND11 functioning as a current source. However, any element may be used as the current source and the N-channel MOS transistor MND11 may be replaced by a current source of a plurality of enhancement transistors and by a single resistance.

According to the above-described configuration, the fuses 11 to 14 realize an arbitrary combination of the connection/cut states of the fuses prior to the fuse cuttings depending on combinations of voltages applied to the nodes FT11 to FT14. Accordingly, an internal state equivalent to a case when the fuses have been cut can be realized by the fuse circuits 11 to 14 prior to the fuse cutting and the switch control signals with same signal levels as those after the fuse cutting can be outputted.

Next, an outline of an offset voltage adjusting method will be described. When the offset voltage is adjusted in designing steps, a desired adjustment value sometimes cannot be obtained because of a variation of the elements on manufacture. For this reason, when the adjustment in a high accuracy should be performed, it is required to know the offset voltage after the fuse cutting prior to the fuse cuttings. The semiconductor device 1 according to the present embodiment realizes the internal state equivalent to the case after the fuse cutting without cutting the fuses by applying a predetermined magnitude of voltage to the nodes FT11 to FT14 before the fuses F11 to F14 are cut. Accordingly, the adjustment of the offset voltage in the high accuracy can be realized.

Details of an operation of the offset adjusting section 20 will be described here. The N-channel MOS transistors MN21 to MN23 and the N-channel MOS transistors MN40A and MN40B receive the switch control signals S11 to S13, S14, and S14B. The N-channel MOS transistors MN21 to MN23 are in the OFF state when the switch control signals S11 to S13 are in a low level (the fuses F11 to F13 are in the cut state or in a state equivalent to the cut state), paths to the constant current sources I21 to I23 connected between the N-channel MOS transistors MN21 to MN23 and the ground power supply GND are blocked. Since the current from the differential amplifier 30 is not branched to the blocked paths, the offset adjusting section 20 does not contribute to the adjustment of the offset voltage. The N-channel MOS transistors MN21 to MN23 are in ON states when the switch control signals S11 to S13 are in the high levels, and the offset adjusting section 20 contributes to the adjustment of the offset voltage when the fuse F11 to F13 are in the connection state.

In the present embodiment, three constant current sources I21 to I23 having different current drive abilities are prepared and a ratio of the current drive abilities is set to: I1:I2:I3=1: 2:4. The 16 adjustment values of patterns 1 to 8 or patterns 9 to 16 shown in FIG. 4 can be realized by combining operational states of the three current sources. The N-channel MOS transistor MN40A and the N-channel MOS transistor MN40B play a role of the switches in the current path between the nodes N31 and N32 of the differential amplifier 30 and the offset adjusting section 20 and the switches operate in response to the switch control signal S14 and the switch control, signal S14B having a logic obtained by inverting the signal S14. Since either one of the N-channel MOS transistor MN40A and the N-channel MOS transistor MN40 is in the ON state, a current is outputted from a current path connected to either one of the nodes N31 and N32 in the differential amplifier 30.

In the present embodiment, when the switch control signal S14 is in a low level, the N-channel MOS transistor MN40A is in the OFF and the N-channel MOS transistor MN40B is in the ON, so that the current for the offset voltage adjustment is branched from the current path of the node N31 to the offset adjusting section 20, and the offset voltage is adjusted to be a minus side (the patterns 1 to 8) On the contrary, when the switch control signal S14 is in the high level, the N-channel MOS transistor MN40A is in the ON and the N-channel MOS transistor MN40B is in the OFF, so that the current for the offset voltage adjustment is branched from the current path of the node N32 to the offset adjusting section 20, and the offset voltage is adjusted to be a plus side (the patterns 9 to 16). As described above, the offset voltage is adjusted as shown in FIG. 4 by the operation of the offset adjusting section 20 based on the switch control signals 311 to S14 according to the connection/cut states of the fuses F11 to F14 or to voltages supplied to the nodes FT11 to FT14.

The signal levels of the switch control signals S11 to S14 are determined according to the connection/cut states of the fuses F11 to F14. In addition, according to the present embodiment, the switch control signals S11 to S14 having the same signal levels as those of the cut states of the fuses F11 to F14 are outputted by applying predetermined voltages to the nodes FT11 to FT14. That is to say, the offset voltage can be adjusted so as to be any of the 16 patterns shown in FIG. 4 by appropriately setting a combination of voltages applied to the nodes FT11 to FT14.

A specific example of the offset adjusting method will be described below. The adjusting method for the semiconductor device 1 having the adjustment patterns shown in FIG. 4 will be described here.

At first, an offset voltage of the differential amplifier 30 is measured in a state that all the fuses F11 to F14 are connected (step S1). It is assumed that the measured offset voltage is −3 mV. Subsequently, the connection/cut state (the internal state) of the fuse section 10 is determined so that the offset voltage can be 0V (step S2). Since the offset voltage needs to be adjusted by the voltage of −3 mV in this case, "4" as the connection/cut pattern of the fuses (the fuses F11 and F12 are connected and the fuses F13 and F14 are cut) is selected with reference to FIG. 4.

Subsequently, voltages applied to the nodes FT11 to FT14 are set so that the connection/cut pattern determined in step S2 can be realized, and the offset adjustment which does not cut the fuses is performed (step S3). The voltages set to realize the pattern "4" are applied to the nodes FT11 to FT14 and the offset adjustment is performed. Specifically, the voltage of (VCC−3)V is applied to the nodes FT13 and FT14 without applying the voltage to the nodes FT11 and FT12 to maintain the connection state of the fuses F11 and F12 in order to realize the cut state of the fuses F13 and F14. According to this, the signal levels of the switch control signals S13 and S14 from the fuse circuits 13 and 14 are in the low level without cutting the fuses F13 and F14, and the offset adjustment can be performed by the adjustment voltage corresponding to the pattern "4".

The offset voltage in this state is measured, and it is determined whether or not this voltage is within a range of a desired offset voltage (for example, within ±0.5 mV) (step S4). When the measured offset voltage stays within the range of the desired offset voltage, the fuses F13 and F14 are actually cut (step S4 Yes, S5). That is to say, the fuses F13 and F14 are cut by applying the voltage of (VCC−20)V to the nodes FT13 and FT14, and the adjustment of the offset voltage is completed.

In contrast, when the offset voltage obtained at step S4 is beyond the desired offset voltage range, the adjustment and determination of the offset voltage is performed by setting another connection/cut pattern again (step S4 NO, S6). In fact, an adjustment value as designed may not be obtained because of the variation of the elements manufacture. When the offset voltage after the adjustment is +0.6 mV for example, the adjustment value of the offset voltage set last time must be not −3 mV but −2.4 mV. Consequently, a connection/cut pattern "5" capable of widely adjusting the voltage in a minus direction is set in the next offset adjustment, and the offset adjustment is performed without cutting the fuses. Here, a voltage is not applied to the node FT13 since only the fuse F13 is in the connection state here, and the measurement and determination of the offset voltage is performed by applying the voltage of (VCC−3)V to the nodes FT11, FT12, and FT14 in order to realize the cut state of the fuses F11, F12, and F14.

When the offset voltage measured at step S6 stays within the range of the desired offset voltage, the adjustment of the offset voltage is completed after cutting the fuses in accordance with the connection/cut pattern used in the present offset adjustment (step S7). On the other hand, when an absolute value of the offset voltage measured after a second offset adjustment is larger than an absolute value of the offset voltage obtained in the previous (a first) offset adjustment, the fuses are cut in accordance with the connection/cut pattern used in the previous offset adjustment (step S8). For example, assuming that the offset voltage measured at step S6 is −0.3 mV that is within the range of the desired offset voltage, the fuses F11, F12, and F14 are cut by applying the voltage of (VCC−20)V to the nodes FT11, FT12, and FT14 in accordance with the pattern "5". However, when the obtained offset voltage is −0.7 mV, since the absolute value of 0.7 mV is larger than 0.6 mV that is the absolute value of +0.6 mV obtained at step S4, the fuses F13 and F14 are cut by applying the voltage of (VCC−20)V to the nodes FT13 and FT14 in accordance with the pattern "4".

According to the present invention as described above, the offset voltage after the fuse cutting can be realized without cutting the fuses by applying a predetermined voltage to the nodes of the fuses. The set offset voltage cannot be obtained generally because of the variation of the elements on the manufacture. However, the offset adjustment can be performed in a high accuracy since the offset voltage can be changed without cutting the fuses. In addition, according to the present invention, the P-channel MOS transistor MP11 plays a role of a switch for controlling a current path to the N-channel MOS transistor MND11, that is, a current source. Accordingly, a current to the N-channel MOS transistor MND11 can be blocked by setting the P-channel MOS transistor MP11 to the OFF state. For this reason, there is no need to withdraw a current to the nodes like the conventional technique and the problems described above do not occur. In addition, there is no need to provide a new node for the offset adjustment since the offset adjustment is performed by using the cutting nodes. Consequently, a problem of increasing a circuit area because of an addition of nodes does not occur.

Second Embodiment

Figure 5:
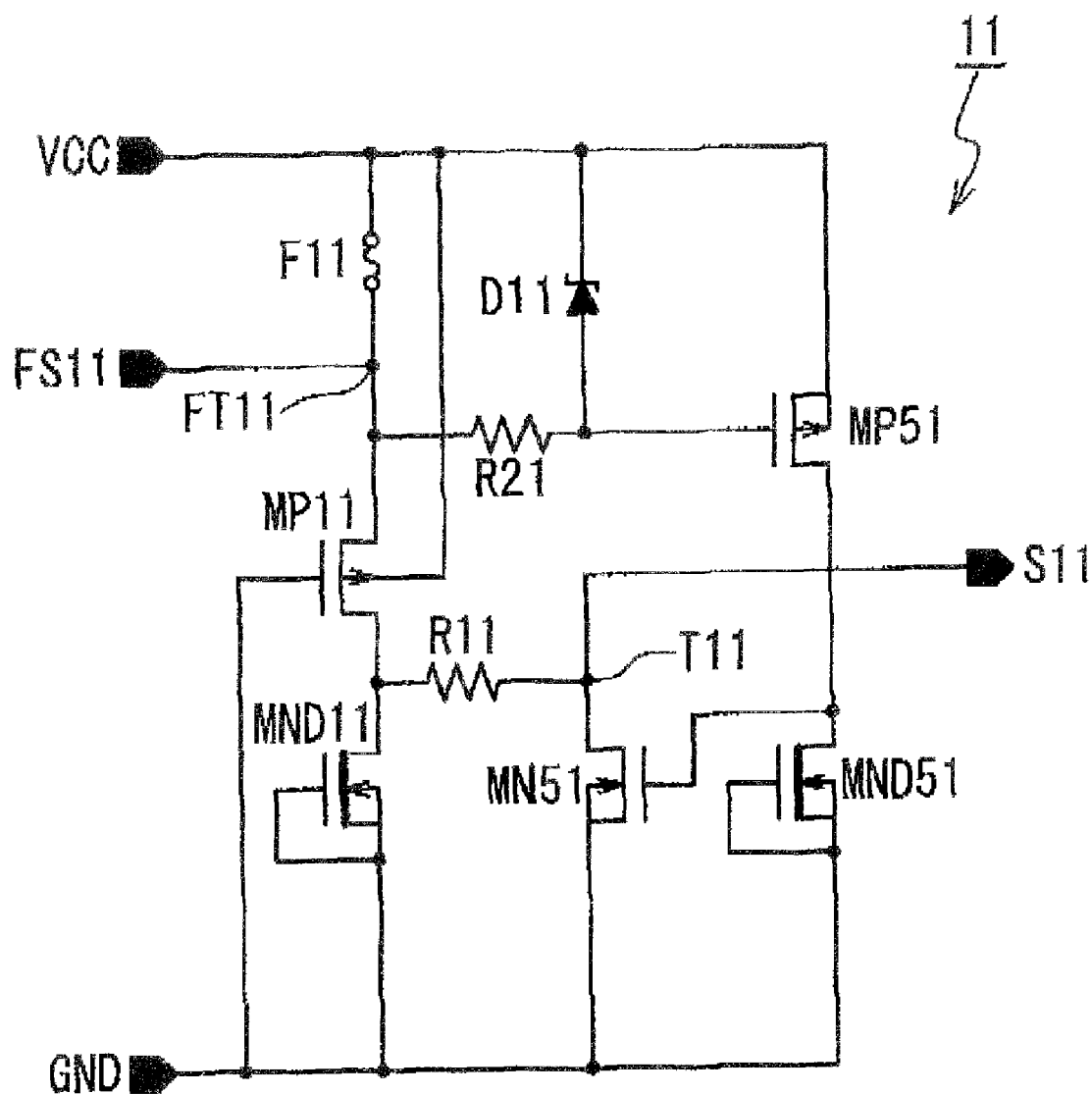
FIG. 5 is a circuit diagram showing a configuration in a second embodiment of the fuse circuit according to the present invention.

The semiconductor device 1 in a second embodiment of the present invention includes fuse circuits 11 to 14 having a configuration shown in FIG. 5 instead of the fuse circuits 11 to 14 in the semiconductor device 1 shown in FIG. 2. The configurations of the offset adjusting section 20 and the differential amplifier 30 in the second embodiment are the same as those of the first embodiment and their description is omitted.

Referring to FIG. 5, details of configurations of the fuse circuits 11 to 14 in the second embodiment will be described. Since the fuse circuits 11 to 14 have the same configuration, only the configuration of the fuse circuit 11 will be described in detail and others are omitted.

Referring to FIG. 5, the fuse circuit 11 in the second embodiment includes an N-channel MOS transistor MN51 connected between the output node T11 and the ground voltage GND, a P-channel MOS transistor MP51 connected between the power supply voltage VCC and a gate of the N-channel MOS transistor MN51, and the N-channel MOS transistor MND51 of the depletion type connected between the GND voltage and the gate of the N-channel MOS transistor MN51. To be more detailed, a source and the well voltage of the N-channel MOS transistor MN51 are connected to the ground voltage GND, and a drain of the N-channel MOS transistor MN51 is connected to the output node T11. In addition, it is preferable that a resistance R11 is provided between the drain of the N-channel MOS transistor MN51 and the drain of the N-channel MOS transistor MND11 (the source of the P-channel MOS transistor MP11). A threshold voltage of the P-channel MOS transistor MP51 is preferably lower than a voltage at which the fuse 11 is melted. The source and the well voltage of the P-channel MOS transistor MP51 are connected to the power supply voltage VCC, and the drain of the P-channel MOS transistor MP51 is connected to the gate of the N-channel MOS transistor MN51 and to a drain of the N-channel MOS transistor MND51. In addition, it is preferable that the gate of the P-channel MOS transistor MP51 is connected to the node FT11 via a resistance R21 and that a diode D11 connected in a reverse direction is provided between the gate of the P-channel MOS transistor MP51 and the power supply VCC. The diode D11 and the resistance R21 protect the gate of the P-channel MOS transistor MP51 when the fuse is cut. The gate, source, and well voltage of the N-channel MOS transistor MND51 are connected to the ground voltage GND, and the drain of the N-channel MOS transistor MND51 is connected to the gate of the N-channel MOS transistor MN51 and to the drain of the P-channel, MOS transistor MP51.

(Operation of the Fuse Circuit)

Next, an operation of the fuse circuit 11 in the second embodiment will be described. Where a magnitude of the threshold voltage in the P-channel MOS transistor MP51 is about 1V, for example, the P-channel MOS transistor MP51 is in an ON state when a voltage of about (VCC−1)V is applied to the node FT11. According to this, the drain voltage of the N-channel MOS transistor MND51 and the gate voltage of the N-channel MOS transistor MN51 are in a level of the power supply VCC. Since the gate voltage is in the high level (the VCC voltage level), the N-channel MOS transistor MN51 is in the ON state and lowers the voltage of the output node T11 to the low level (the GND voltage level). As described above, a same signal level as that of the output node T11 when cutting the fuse F11 can be realized by applying the voltage of about (VCC−1)V to the node FT11.

When the voltage of about (VCC−1)V is applied to the node FT11, the P-channel MOS transistor MP11 may be in the ON state. In this case, without the resistance R11, a signal level of the output node T11 will be an intermediate voltage between the power supply voltage VCC and the ground voltage GND because of the ground voltage GND to be outputted by the N-channel MOS transistor MN51 and the power supply voltage VCC to be outputted by the N-channel MOS transistor MND11. In the present embodiment, the supply of the power supply voltage VCC to the output node T11 can be prevented by the resistance R11 provided between the drain of the N-channel. MOS transistor MND11 and the drain of the N-channel MOS transistor MN51. In addition, an operation when the fuse is actually cut is performed by the P-channel MOS transistors MP11 and MND11 similar to the first embodiment.

Depending on a fuse used for the fuse circuit, the fuse is sometimes damaged even when the voltage applied to the node FT11 is low voltage. However, in the second embodiment, an internal state equivalent to the case of cutting the fuse can be realized by applying the voltage determined based on the threshold voltage of the P-channel MOS transistor MP51. Accordingly, the voltage applied to the fuse can be set to be lower.

Third Embodiment

Figure 6:
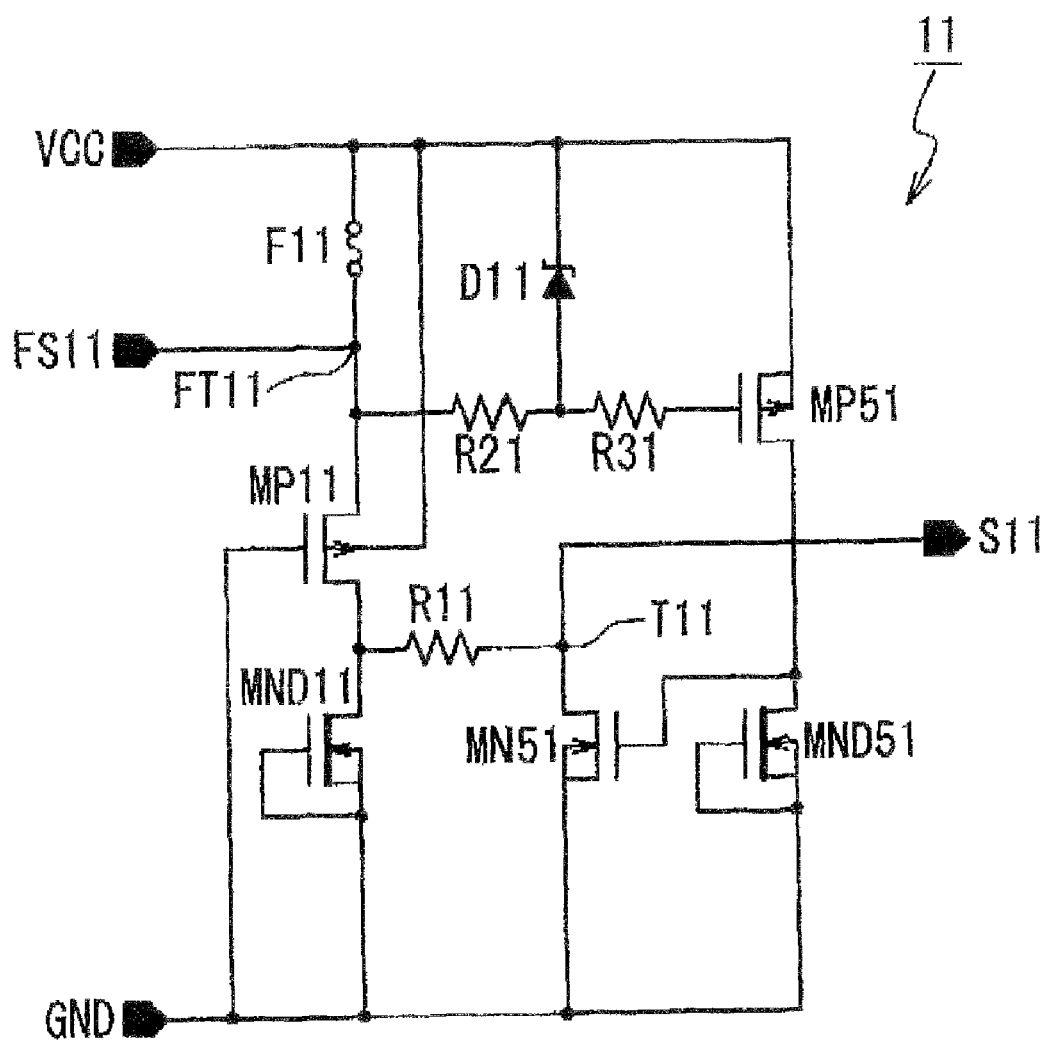
FIG. 6 is a circuit diagram showing a configuration in a third embodiment of the fuse circuit according to the present invention.

The semiconductor device 1 in a third embodiment includes fuse circuits 11 to 14 having a configuration shown in FIG. 6 instead of the fuse circuits 11 to 14 in the semiconductor device 1 shown in FIG. 2. The configurations of the offset adjusting section 20 and the differential amplifier 30 in the third embodiment are the same as those of the first embodiment and their description is omitted.

Referring to FIG. 6, details of configurations of the fuses 11 to 14 in the third embodiment will be described. Since the fuse circuits 11 to 14 have the same configuration, only the configuration of the fuse circuit 11 will be described in detail and others are omitted.

Referring to FIG. 6, the fuse circuit 11 in the third embodiment includes a resistance R31 connected between the gate of the P-channel MOS transistor MP51 and the diode D11 in addition to a configuration of the fuse circuit 11 in the second embodiment. The resistance R31 is connected to the gate of the P-channel MOS transistor MP51 and an anode of the diode D11 and the resistance R21. The gate of the P-channel MOS transistor MP51 in the third embodiment is connected to the output node T11. Other configurations are the same as those of the second embodiment.

Next, an operation of the fuse circuit 11 in the third embodiment will be described. In the third embodiment, since the output node T11 is connected to the gate of the P-channel MOS transistor MP51, the fuse circuit 11 operates as a latch circuit. To be more detailed, an ON/OFF state of the P-channel MOS transistor MP51 is determined depending on the signal level of the output node T11 and an ON/OFF state of the N-channel MOS transistor MN51 is determined based on this. Accordingly, the signal level of the output node T11 is maintained. When the output node T11 is in the low level, for example, the P-channel MOS transistor MP51 is in the ON state, and the voltage of the high level is supplied for the gate of the N-channel MOS transistor MN51, and the N-channel MOS transistor MN31 is in an ON state. Accordingly, the output node can maintain the low level (the GND voltage level). In the third embodiment as described above, when the signal level of the output node T11 is determined based on the signal level supplied to the node FT11, the signal level of the output node T11 (the switch control signal S11) is maintained if any voltage is not applied to the node FT11. Therefore, according to the semiconductor device 1 in the third embodiment, a signal applied to the node T11 may have a pulse shape and a time for which a voltage is applied to the fuse F11 can be shortened. Accordingly, the damage of the fuse can he further reduced.

Figure 7:
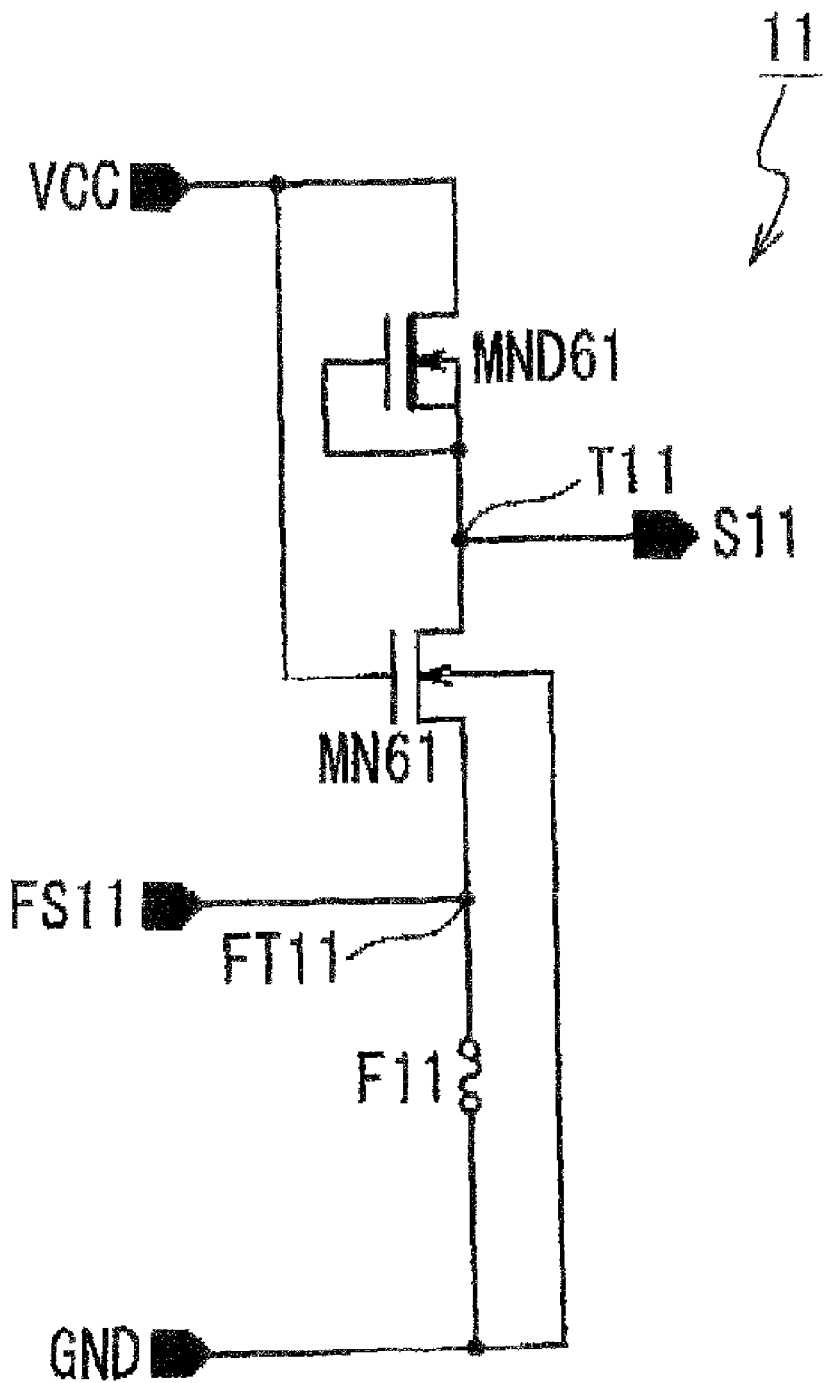
FIG. 7 is a circuit diagram showing a modified example of the first to third embodiments of the fuse circuit according to the present invention.

The embodiments of the present invention have been described in details. However, specific configurations are not limited to the above-mentioned embodiments and modifications within a scope of the present invention are also included in the present invention. In the first to third embodiments, the current source (the N-channel MOS transistor MND11) is positioned on the ground voltage GND side and the P-channel transistor is positioned between the current source and the fuse F11. However, the configuration is not limited to this. As shown in FIG. 7, an N-channel MOS transistor MND61 is positioned on the power supply voltage VCC side, and the N-channel MOS transistor MN61 is arranged between the fuse F11 positioned on the ground voltage GND side and the current source (the N-channel MOS transistor MND61) thereby to realize a desired function. In this case, the signal level of the switch control signal S11 outputted from the node T11 has a reversed position with respect to the first to third embodiments.

Specifically, the output node T11 is in the high level (the power supply voltage VCC) in the fuse cutting and is in the low level (the ground voltage GND) in the connection of the fuse. In addition, the voltage applied to the node FT11 in the fuse cutting is about (ground voltage+20)V. Furthermore, when the voltage of about (ground voltage GND+3)V (the first embodiment) or about (ground voltage GND+1)V (the second and third embodiments) is applied to the node FT11, the N-channel MOS transistor MN61 is in an OFF state, and the fuse cut state can be realized without cutting the fuse. In addition, when the current drive ability of the N-channel MOS transistor MN61 is set to be larger than the current drive ability of the N-channel MOS transistor MND11 of the depletion type, the voltage of the output node T11 is the same level as that of the ground voltage GND in the connection state of the fuse F11.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device, comprising:
a fuse section having a plurality of fuse circuits configured to generate switch control signals,
wherein each of said plurality of fuse circuits comprises:
a fuse connected between a first power supply voltage and a cut node;
a current source connected between a second power supply voltage and an output node; and
a first transistor connected between said output node and said cut node and having a gate connected to said second power supply voltage,
wherein said current source comprises a second transistor whose source and gate are connected with said second power supply voltage, and whose drain is connected with said output node and a drain of said first transistor, and a source of said first transistor is connected with said cut node and said fuse, and
wherein the second transistor is an N-channel MOS transistor of a depletion type.

2. The semiconductor device according to claim 1, wherein said fuse circuit further comprises:
a third transistor connected between said output node and said second power supply voltage;
a fourth transistor connected between said first power supply voltage and the gate of said third transistor, and having a gate connected with the cut node,
a fifth transistor connected between said second power supply voltage and the gate of said third transistor and having a gate connected with said second power supply voltage.

3. The semiconductor device according to claim 2, wherein said fuse circuit further comprises a first resistance connected between said output node and the drain of said second transistor.

4. A semiconductor device, comprising:
a fuse section having a plurality of fuse circuits configured to generate switch control signals,
wherein each of said plurality of fuse circuits comprises:
a fuse connected between a first power supply voltage and a cut node;
a current source connected between a second power supply voltage and an output node; and
a first transistor connected between said output node and said cut node and having a gate connected to said second power supply voltage,
wherein said current source comprises a second transistor whose source and gate are connected with said second power supply voltage, and whose drain is connected with said output node and a drain of said first transistor, and a source of said first transistor is connected with said cut node and said fuse,
wherein said fuse circuit further comprises:
a third transistor connected between said output node and said second power supply voltage;
a fourth transistor connected between said first power supply voltage and the gate of said third transistor, and having a gate connected with the cut node;
a fifth transistor connected between said second power supply voltage and the gate of said third transistor and having a gate connected with said second power supply voltage;
a second resistance connected between the gate of said fourth transistor and the cut node; and
a diode connected between the gate of said fourth transistor and said first power supply voltage.

5. The semiconductor device according to claim 4, further comprising:
a third resistance connected between said second resistance and the gate of said fourth transistor,
wherein the gate of said fourth transistor is connected with the output node through a node between said third resistance and the gate of said fourth transistor.

6. The semiconductor device according to claim 1, wherein said first transistor is a P channel transistor, and said first power supply voltage is higher than said second power supply voltage.

7. The semiconductor device according to claim 1, wherein said first transistor is an N-channel transistor, and said first power supply voltage is lower than said second power supply voltage.

8. The semiconductor device according to claim 1, wherein said fuse section generates said switch control signals based on an adjustment data supplied to the cut nodes without cutting any fuses.

9. The semiconductor device according to claim 8, wherein said fuses of said plurality of fuse circuits are selectively cut based on a fuse cut data corresponding to the adjustment data and supplied to said cut nodes.

10. The semiconductor device according to claim 1, wherein a well voltage of the first transistor is supplied with the first power supply voltage.

11. The semiconductor device according to claim 4, wherein the second transistor is an N-channel MOS transistor of a depletion type.

12. The semiconductor device according to claim 2, wherein said fuse circuit further comprises:
 a second resistance connected between the gate of said fourth transistor and the cut node; and
 a diode connected between the gate of said fourth transistor and said first power supply voltage.

13. The semiconductor device according to claim 1, further comprising:
 a third resistance connected between said second resistance and the gate of said fourth transistor,
 wherein the gate of said fourth transistor is connected with the output node through a node between said third resistance and the gate of said fourth transistor.

14. The semiconductor device according to claim 4, wherein said fuse circuit further comprises a first resistance connected between said output node and the drain of said second transistor.

15. The semiconductor device according to claim 4, wherein said first transistor is a P channel transistor, and said first power supply voltage is higher than said second power supply voltage.

16. The semiconductor device according to claim 4, wherein said first transistor is an N-channel transistor, and said first power supply voltage is lower than said second power supply voltage.

17. The semiconductor device according to claim 4, wherein said fuse section generates said switch control signals based on an adjustment data supplied to the cut nodes without cutting any fuses.

18. The semiconductor device according to claim 17, wherein said fuses of said plurality of fuse circuits are selectively cut based on a fuse cut data corresponding to the adjustment data and supplied to said cut nodes.

19. The semiconductor device according to claim 4, wherein a well voltage of the first transistor is supplied with the first power supply voltage.

* * * * *